US 6,611,220 B1

(12) United States Patent
Snyder

(10) Patent No.: US 6,611,220 B1
(45) Date of Patent: Aug. 26, 2003

(54) ARCHITECTURE FOR DECIMATION ALGORITHM

(75) Inventor: Warren Snyder, Snohomish, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 09/973,535

(22) Filed: Oct. 9, 2001

Related U.S. Application Data

(60) Provisional application No. 60/243,708, filed on Oct. 26, 2000.

(51) Int. Cl.[7] ................................................. H03N 3/00
(52) U.S. Cl. ....................................... 341/143; 341/144
(58) Field of Search ................................. 341/143, 144, 341/118, 120; 708/313

(56) References Cited

U.S. PATENT DOCUMENTS 5,196,850 A * 3/1993 Duffy et al. ................. 341/143
5,202,687 A   4/1993 Distinti ....................... 341/158
6,144,327 A  11/2000 Distinti et al. .............. 341/126
6,281,718 B1 * 8/2001 Page et al. .................. 327/106

* cited by examiner

Primary Examiner—Peguy JeanPierre
Assistant Examiner—Joseph Lauture
(74) Attorney, Agent, or Firm—Wagner, Murabito, & Hao LLP

(57) ABSTRACT

A new architecture for implementing a digital algorithm such as a decimation algorithm is described. The new decimator circuit is well suited for digital circuits such as a delta-sigma (or sigma-delta) analog-to-digital converter. In particular, the new decimator circuit incorporates a general purpose architecture which enables a wide range of flexibility to change and modify the decimation algorithm performed by the decimator circuit. Moreover, the new decimator circuit can be fabricated in a smaller chip area than previously possible.

21 Claims, 2 Drawing Sheets

ARCHITECTURE FOR DECIMATION ALGORITHM

RELATED U.S. APPLICATION

This application claims priority to the copending provisional patent application, Ser. No. 60/243,708, entitled "Advanced Programmable Microcontroller Device," with filing date Oct. 26, 2000, and assigned to the assignee of the present application.

BACKGROUND OF THE INVENTION

1. Field of the Invention

The present invention generally relates to digital circuits. More particularly, the present invention relates to the field of circuit architectures for implementing decimation algorithms.

2. Related Art

The technology environment for digital signal processing (DSP) is rapidly changing. DSP performance continues to increase at a fairly constant rate across the industry, and the complexity of DSP peripherals is also expanding. The performance goal of a DSP architecture is to perform as many arithmetic operations as possible in the smallest number of clock cycles. But whereas DSP-centric applications have traditionally employed processors designed for DSP tasks, a complementary, and competing, technology has emerged. Microcontroller suppliers are offering DSP-specific functionality to their architectures.

The analog-to-digital converter (ADC) converts an external analog signal (typically relative to voltage) to a digital representation. Devices such as a microcontroller or DSP processor that have a ADC can be used for instrumentation, environmental data logging, or any other application that lives in an analog world. An overwhelming variety of ADCs exist on the market today, with differing resolutions, bandwidths, accuracies, architectures, packaging, power requirements, and temperature ranges, as well as hosts of specifications, covering a broad range of performance needs.

One popular ADC architecture is the delta-sigma (or sigma-delta) ADC. FIG. 1 illustrates a conventional delta-sigma ADC 100. As illustrated in FIG. 1, the conventional delta-sigma ADC 100 has an analog block (not shown) which performs the analog-to-digital conversion and generates an output stream of 1s (or high) and 0s (or low). Moreover, the conventional delta-sigma ADC 100 has a filter 20 which converts the output 10 of the analog block (not shown) into a digital value 50 having a format suitable for the microcontroller, DSP processor, etc.

The filter 20 includes a (1 bit to Y bits) converter 30 and a conventional decimator 40. The (1 bit to Y bits) converter 30 generates a Y-bit output of +1 values or −1 values, depending on whether the output 10 of the analog block (not shown) is 1 or 0 (high or low).

The conventional decimator 40 performs a decimation algorithm using a plurality of discrete circuit stages 50A, 50B, and 50C which are synchronously clocked with the signal CLK. Typically, these discrete circuit stages 50A, 50B, and 50C perform either an integration operation or a differentiation operation. Moreover, each of the discrete circuit stages 50A, 50B, and 50C typically includes an adder and at least one register for implementing an accumulator-type of circuit. The circuit architecture for the conventional decimator 40 is inefficient in terms of circuit area and cost. Moreover, the circuit architecture for the conventional decimator 40 does not provide flexibility to change the decimation algorithm once the conventional decimator 40 had been fabricated.

SUMMARY OF THE INVENTION

A new architecture for implementing a digital algorithm such as a decimation algorithm is described. The new decimator circuit is well suited for digital circuits such as a delta-sigma (or sigma-delta) analog-to-digital converter. In particular, the new decimator circuit incorporates a general purpose architecture which enables a wide range of flexibility to change and modify the decimation algorithm performed by the decimator circuit. Moreover, the new decimator circuit can be fabricated in a smaller chip area than previously possible.

Instead of having multiple discrete circuit stages as in the conventional decimator circuit, the decimator circuit of the present invention includes a multiplexer, an adder, and a random access memory (RAM), whereas a plurality of signals control the operation of the multiplexer, the adder, and the RAM such that in a clock cycle at least a portion of a stage of the decimation algorithm is performed. In an embodiment, a state machine is operative to generate the plurality of signals for controlling operation of the multiplexer, the adder, and the RAM. Alternatively, a controller is operative to generate the plurality of signals for controlling operation of the multiplexer, the adder, and the RAM.

These and other advantages of the present invention will no doubt become apparent to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
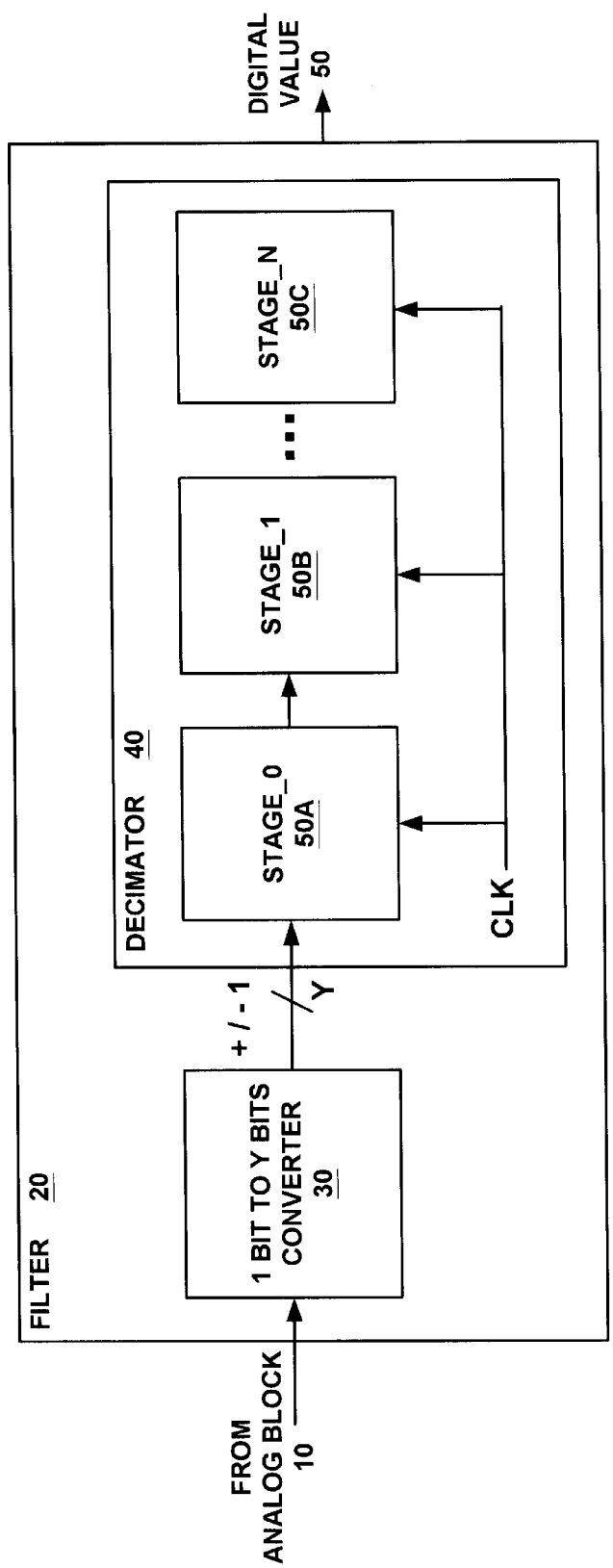
FIG. 1 illustrates a conventional delta-sigma ADC, showing a conventional decimator.
Figure 2:
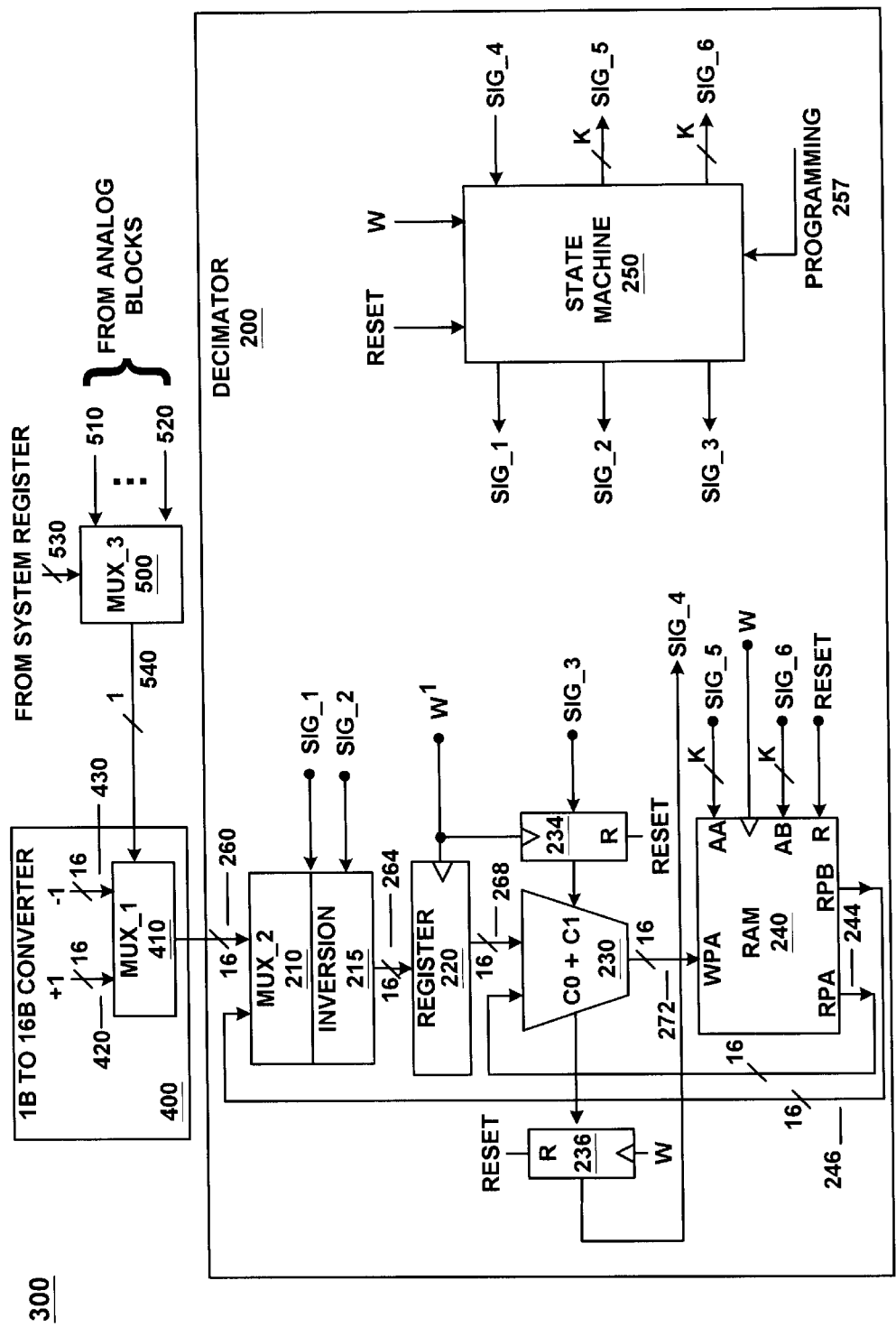
FIG. 2 illustrates a decimator circuit in accordance with an embodiment of the present invention, showing the decimator circuit implemented in a delta-sigma ADC.

FIG. 2 illustrates a decimator circuit 200 in accordance with an embodiment of the present invention, showing the decimator circuit 200 implemented in a delta-sigma ADC 300. A new architecture for implementing a digital algorithm such as a decimation algorithm is depicted in FIG. 2. The decimator circuit 200 is well suited for digital circuits such as a delta-sigma (or sigma-delta) analog-to-digital converter 300. In particular, the decimator circuit 200 incorporates a general purpose architecture which enables a wide range of flexibility to change and modify the decimation algorithm performed by the decimator circuit 200. Moreover, the new decimator circuit 200 can be fabricated in a smaller chip area than previously possible. In addition, the decimator circuit 200 decomposes the synchronously clocked multiple stages (as illustrated in FIG. 1) of the decimation algorithm into a single discrete architecture characterized by several clock cycles, whereas in a clock cycle at least a portion of a stage of the decimation algorithm is performed.

As illustrated in FIG. 2, the delta-sigma ADC 300 has a plurality of analog blocks (not shown), each performs the analog-to-digital conversion of separate external analog signal and generates an output stream of 1 s (or high) and 0 s (or low). The output 510 and 520 of each analog block is coupled to the multiplexed inputs of the multiplexer 500 (or mux_3). The signal 530 from a system register determines which one of the multiplexed inputs is coupled to the multiplexer output 540. The signal 530 may be of a length greater than one bit. In order to convert the multiplexer output 540 into a digital value having a format suitable for the microcontroller, DSP processor, etc., the delta-sigma ADC 300 has a (1 bit to 16 bits) converter 400 and a decimator circuit 200. The (1 bit to 16 bits) converter 400 receives the multiplexer output 540 and is coupled to the decimator circuit 200. Moreover, the (1 bit to 16 bits) converter 400 has a multiplexer 410 (or mux_1) that has a first multiplexed input 420 and a second multiplexed input 430. The multiplexer 410 generates a 16-bit output of +1 values or −1 values via multiplexer output 260, depending on whether the multiplexer output 540 of mux_3 is 1 or 0 (high or low). The decimator circuit 200 receives the multiplexer output 260. It should be understood that the delta-sigma ADC 300 can have other configurations.

Instead of having multiple discrete circuit stages as in the conventional decimator circuit 40 of FIG. 1, the decimator circuit 200 of the present invention includes a multiplexer 210, an adder 230, and a random access memory (RAM) 240, whereas a plurality of signals (e.g., Sig_1, Sig_2, Sig_3, etc.) control the operation of the multiplexer 210, the adder 230, and the RAM 240 such that in a clock cycle at least a portion of a stage of the decimation algorithm is performed. In an embodiment, the decimator circuit 200 includes a state machine 250 which is operative to generate the plurality of signals (e.g., Sig_1, Sig_2, Sig_3, etc.) for controlling operation of the multiplexer 210, the adder 230, and the RAM 240. Alternatively, the decimator circuit 200 includes a controller (not shown) which is operative to generate the plurality of signals (e.g., Sig_1, Sig_2, Sig_3, etc.) for controlling operation of the multiplexer 210, the adder 230, and the RAM 240.

The response of the decimator algorithm used in filtering applications, such as in a delta-sigma ADC, can be described as:

$$H(z)=[(1-z^{-L})/(1-z^{-1})]^M$$

whereas M is the order of the decimation filter and L is the level of decimation. Moreover, this response shows that the decimation algorithm can have various implementations. In FIG. 1, the conventional decimator circuit 40 typically includes M integrator stages cascaded with M differentiator stages, whereas these stage are synchronously clocked and whereas each stage typically includes an adder and at least one register to perform either the integration operation or the differentiation operation.

Unlike the conventional decimator circuit 40 of FIG. 1 which utilizes multiple adders, the decimator circuit 200 (FIG. 2) of the present invention utilizes a single adder 230. The input 268 to the adder 230 is multiplexed to provide flexibility. Rather than utilizing a plurality of registers for storing an accumulator value of each stage of the decimation algorithm, the decimator circuit 200 (FIG. 2) of the present invention utilizes a RAM 240 having a plurality of memory locations or words, whereas theses memory locations or words can store accumulator values corresponding to different stages of the decimation algorithm. The RAM 240 provides a more space efficient implementation of data storage than the plurality of registers of the conventional decimator circuit 40 (FIG. 1).

Rather than performing the multiple stages of the decimation algorithm in a single clock cycle as in the conventional decimator circuit 40 (FIG. 1), the decimator circuit 200 (FIG. 2) of the present invention uses several clock cycles to perform the multiple stages of the decimation algorithm, whereas in a clock cycle at least a portion of a stage of the decimation algorithm is performed. In essence, data is moved through the multiple stages of the decimation algorithm in several clock cycles rather than in one clock cycle. The decimator circuit 200 (FIG. 2) of the present invention can be clocked at a higher rate than the conventional decimator circuit 40 (FIG. 1) to prevent performance degradation in a system in which the decimator circuit 200 (FIG. 2) of the present invention is incorporated to take advantage of the decimator circuit's 200 chip area efficiency relative to the conventional decimator circuit 40 (FIG. 1).

Referring to FIG. 2, the decimator circuit 200 includes the multiplexer 210 (or mux_2). The multiplexer 210 has a first 16-bit multiplexed input coupled to the output port RPB of the RAM 240. The multiplexer 210 has a second 16-bit multiplexed input coupled to the input signal generated at the multiplexer output 260 of mux_1. The multiplexer 210 has a multiplexer output 264 for outputting the selected one of the first and second multiplexed inputs based on the signal Sig_1. Moreover, the multiplexer 210 includes an inversion circuit 215 which generates a negative version of the selected one of the first and second multiplexed inputs at the multiplexer output 264 based on the signal Sig_2. The signal Sig_1 is a selection signal for selecting one of the first and second multiplexed inputs of the multiplexer 210. The signal Sig_2 is an inversion signal for indicating whether to generate a negative version of the selected one of the first and second multiplexed inputs at the multiplexer output 264.

The decimator circuit 200 further includes an adder 230 and a register 220 which prevents race conditions since a memory location or word of the RAM 240 will be read from and written to in a clock cycle of the decimator circuit 200. The adder 230 has a first 16-bit input coupled to the output port RPA of the RAM 240. The adder 230 has a second 16-bit input coupled to the output of the register 220 whose input is coupled to the multiplexer output 264 of mux_2. The adder 230 has an adder output 272 coupled to the input port WPA of the RAM 240. Moreover, the adder 230 has a carry-in port CI coupled to the output of a first flip-flop 234 whose input is coupled to the signal Sig_3, whereas the signal Sig_3 is a carry-in signal for the adder 230. The adder 230 has a carry-out port CO coupled to the input of a second flip-flop 236 whose output provides the signal Sig_4, whereas the signal Sig_4 is a carry-out signal of the adder 230. The first flip-flop 234 and the register 220 are clocked by the clock signal W'. The second flip-flop 236 is clocked by the clock signal W.

The decimator circuit 200 further includes the RAM 240 having a plurality of memory locations or words. The memory locations or words store values representing accumulator values. In an embodiment, the RAM 240 has $2^k$ words, each word being 16 bits in length, whereas k is 2. If k is greater than 2, the RAM 240 has more than four words; thus, allowing more complex decimation algorithms, which require additional clock cycles, to be performed. The RAM 240 has the input port (or write port) WPA coupled to the adder output 272, the output port (or read port) RPA 244 coupled to an input of the adder 230, and the output port (or read port) RPB 246 coupled to the first multiplexed input of the mux_2.

Moreover, the RAM 240 includes a first address port AA for selecting one of the plurality of memory locations or words to couple to the output port (or read port) RPA 244 and to the input port (or write port) WPA, whereas the signal Sig_5 is coupled to the first address port AA. In essence, the address at the first address port AA provides the memory location or word that is read from at the output port RPA and that is written to from the input port WPA. The signal Sig_5 is a first address signal. In addition, the RAM 240 includes a second address port AB for selecting one of the plurality of memory locations or words to couple to the output port (or read port) RPB 246, whereas the signal Sig_6 is coupled to the second address port AB. The signal Sig_6 is a second address signal. The RAM 240 is clocked by the clock signal W. Moreover, the signal Reset is coupled to the RAM 240 and to the first and second flip-flops 234 and 236.

Continuing with FIG. 2, in an embodiment the decimator circuit 200 also includes a state machine 250 which is operative to generate the plurality of signals (e.g., Sig_1, Sig_2, Sig_3, Sig_5, and Sig_6) for controlling operation of the multiplexer 210, the adder 230, and the RAM 240 such that to perform the decimation algorithm. Moreover, the state machine 250 receives the signal Sig_4, which is a carry-out signal of the adder 230, from the second flip-flop 236. The state machine 250 includes a terminal 257 for receiving programming information for programming the state machine 250. The state machine 250 is clocked by the clock signal W and is coupled to the signal Reset. It should be understood that the state machine 250 can be replaced by a controller. The state machine 250 in each clock cycle generates the proper values for the signals Sig_1, Sig_2, Sig_3, Sig_5, and Sig_6. Moreover, the decimation algorithm performed by the decimator circuit 200 can be changed or modified by reprogramming the state machine 250 so that to generate a different sequence of values for the signals Sig_1, Sig_2, Sig_3, Sig_5, and Sig_6.

In practice, the decimator circuit 200 is clocked (e.g., clock signals W and W') at a higher rate than the rate at which the data associated with the analog block is clocked into the decimator circuit 200 via the (1 bit to 16 bits) converter 400.

According to an embodiment, in a first clock cycle of the decimator circuit 200 the (1 bit to 16 bits) converter 400 provides a 16-bit output of +1 values or −1 values via the multiplexer output 260, depending on whether the multiplexer output 540 of mux_3 500 is 1 or 0 (high or low). In essence, the first clock cycle accounts for the interaction between the stage_0 50A of FIG. 1 and the converter 30 of FIG. 1. The mux_2 210 receives the input signal from the multiplexer output 260. The state machine 250 (1) generates the signal Sig_1 to cause the mux_2 to select the input signal from the multiplexer output 260 rather than the output port RPB 246 from the RAM 240 and (2) generates the signal Sig_2 to indicate to the inversion circuit 215 that no inversion is required. Moreover, the multiplexer output 264 of the mux_2 210 is clocked into the register 220. In addition, the state machine 250 (1) generates the signal Sig_3 representing the carry-in signal CI for the adder 230 and (2) generates the signal Sig_5 representing a first address signal for a memory location or word for the address port AA for enabling reading at the output port RPA 244 and for enabling writing from the input port WPA. The adder 230 adds the output from the register 220 with the value of the memory location or word at the output port RPA 244 of the RAM 240. Moreover, the adder output 272 (representing an accumulator value) of the adder 230 is written to the memory location or word corresponding to the first address signal Sig_5 provided at the address port AA by the state machine 250. The state machine 250 receives the signal Sig_4 representing the carry-out signal CO of the adder 230.

In a second clock cycle, the decimator circuit 200 adds a previous accumulator value stored in a memory location or word to a next accumulator value stored in a another memory location or word. In essence, the second clock cycle accounts for the interaction between the stage_0 50A of FIG. 1 and the stage_1 50B of FIG. 1. The state machine 250 (1) generates the signal Sig_1 to cause the mux_2 210 to select the output port RPB 246 from the RAM 240 rather than the input signal from the multiplexer output 260, (2) generates the signal Sig_6 representing a second address signal for a memory location or word (representing a previous accumulator value) for the address port AB for enabling reading at the output port RPB 246, and (3) generates the signal Sig_2 to indicate to the inversion circuit 215 whether inversion is required, whereas inversion is required for differentiation operations of the decimation algorithm and whereas non-inversion is required for integration operations of the decimation algorithm. Moreover, the multiplexer output 264 of the mux_2 210 is clocked into the register 220. In addition, the state machine 250 (1) generates the signal Sig_3 representing the carry-in signal CI for the adder 230 and (2) generates the signal Sig_5 representing a first address signal for a memory location or word (representing a next accumulator value) for the address port AA for enabling reading at the output port RPA 244 and for enabling writing from the input port WPA. The adder 230 adds the output from the register 220 with the value of the memory location or word at the output port RPA 244 of the RAM 240. Moreover, the adder output 272 (representing an accumulator value) of the adder 230 is written to the memory location or word corresponding to the first address signal Sig_5 provided at the address port AA by the state machine 250. The state machine 250 receives the signal Sig_4 representing the carry-out signal CO of the adder 230.

This process continues until every stage of the decimation algorithm is performed. If a particular stage generates more than a 16 bit width value, two or more words of the RAM 240 may be required; thus, increasing the number of clock cycles required to perform the particular stage of the decimation algorithm. Moreover, when the (1 bit to 16 bits) converter 400 provides a new 16-bit output of +1 values or −1 values via the multiplexer output 260, the process starts again as described above.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit comprising:
   a multiplexer having a plurality of multiplexed inputs and a multiplexer output for outputting one of said multiplexed inputs, wherein one of said multiplexed inputs is coupled to a input signal;
   an adder having a first input, a second input, and an adder output, wherein said second input receives one of said multiplexed inputs outputted by said multiplexer output; and
   a random access memory (RAM) having a plurality of memory locations, a first output port coupled to said first input of said adder, a second output port coupled to one of said multiplexed inputs of said multiplexer, an input port coupled to said adder output, a first address port for selecting one of said memory locations to couple to said first output port and to said input port, and a second address port for selecting one of said memory locations to couple to said second output port, wherein said multiplexer, said adder, and said RAM perform in a clock cycle at least a portion of a stage of a digital algorithm.

2. A circuit as recited in claim 1 wherein said digital algorithm is a decimation algorithm, and further comprising a state machine operative to generate a plurality of signals for controlling operation of said multiplexer, said adder, and said RAM such that to perform said decimation algorithm.

3. A circuit as recited in claim 2 wherein said plurality of signals includes a selection signal for selecting one of said multiplexed inputs of said multiplexer, an inversion signal for indicating whether to generate a negative version of said selected one of said multiplexed inputs at said multiplexer output, a carry-in signal for said adder, a first address signal for said first address port of said RAM, and a second address signal for said second address port of said RAM.

4. A circuit as recited in claim 1 wherein said digital algorithm is a decimation algorithm, and further comprising a controller operative to generate a plurality of signals for controlling operation of said multiplexer, said adder, and said RAM such that to perform said decimation algorithm.

5. A circuit as recited in claim 4 wherein said plurality of signals includes a selection signal for selecting one of said multiplexed inputs of said multiplexer, an inversion signal for indicating whether to generate a negative version of said selected one of said multiplexed inputs at said multiplexer output, a carry-in signal for said adder, a first address signal for said first address port of said RAM, and a second address signal for said second address port of said RAM.

6. A circuit as recited in claim 1 further comprising a register disposed between said multiplexer output and said second input of said adder.

7. A circuit as recited in claim 1 wherein said input signal has one of a +1 value and a −1 value.

8. A decimator circuit comprising:
   a multiplexer having a plurality of multiplexed inputs and a multiplexer output for outputting one of said multiplexed inputs, wherein one of said multiplexed inputs is coupled to a input signal;
   an adder having a first input, a second input, and an adder output, wherein said second input receives one of said multiplexed inputs outputted by said multiplexer output; and
   a random access memory (RAM) having a plurality of memory locations, a first output port coupled to said first input of said adder, a second output port coupled to one of said multiplexed inputs of said multiplexer, an input port coupled to said adder output, a first address port for selecting one of said memory locations to couple to said first output port and to said input port, and a second address port for selecting one of said memory locations to couple to said second output port, wherein said multiplexer, said adder, and said RAM perform in a clock cycle at least a portion of a stage of a decimation algorithm.

9. A decimator circuit as recited in claim 8 further comprising a state machine operative to generate a plurality of signals for controlling operation of said multiplexer, said adder, and said RAM such that to perform said decimation algorithm.

10. A decimator circuit as recited in claim 9 wherein said plurality of signals includes a selection signal for selecting one of said multiplexed inputs of said multiplexer, an inversion signal for indicating whether to generate a negative version of said selected one of said multiplexed inputs at said multiplexer output, a carry-in signal for said adder, a first address signal for said first address port of said RAM, and a second address signal for said second address port of said RAM.

11. A decimator circuit as recited in claim 8 further comprising a controller operative to generate a plurality of signals for controlling operation of said multiplexer, said adder, and said RAM such that to perform said decimation algorithm.

12. A decimator circuit as recited in claim 11 wherein said plurality of signals includes a selection signal for selecting one of said multiplexed inputs of said multiplexer, an inversion signal for indicating whether to generate a negative version of said selected one of said multiplexed inputs at said multiplexer output, a carry-in signal for said adder, a first address signal for said first address port of said RAM, and a second address signal for said second address port of said RAM.

13. A decimator circuit as recited in claim 8 further comprising a register disposed between said multiplexer output and said second input of said adder.

14. A decimator circuit as recited in claim 8 wherein said input signal has one of a +1 value and a −1 value.

15. A delta-sigma analog-to-digital converter comprising:
   a decimator circuit including:
      a multiplexer having a plurality of multiplexed inputs and a multiplexer output for outputting one of said multiplexed inputs, wherein one of said multiplexed inputs is coupled to a input signal;
      an adder having a first input, a second input, and an adder output, wherein said second input receives one of said multiplexed inputs outputted by said multiplexer output; and
      a random access memory (RAM) having a plurality of memory locations, a first output port coupled to said first input of said adder, a second output port coupled to one of said multiplexed inputs of said multiplexer, an input port coupled to said adder output, a first address port for selecting one of said memory locations to couple to said first output port and to said input port, and a second address port for selecting one of said memory locations to couple to said second output port, wherein said multiplexer, said adder, and said RAM perform in a clock cycle at least a portion of a stage of a decimation algorithm.

16. A delta-sigma analog-to-digital converter as recited in claim 15 wherein said decimator circuit further comprises a state machine operative to generate a plurality of signals for controlling operation of said multiplexer, said adder, and said RAM such that to perform said decimation algorithm.

17. A delta-sigma analog-to-digital converter as recited in claim 16 wherein said plurality of signals includes a selection signal for selecting one of said multiplexed inputs of said multiplexer, an inversion signal for indicating whether to generate a negative version of said selected one of said multiplexed inputs at said multiplexer output, a carry-in signal for said adder, a first address signal for said first address port of said RAM, and a second address signal for said second address port of said RAM.

18. A delta-sigma analog-to-digital converter as recited in claim 15 wherein said decimator circuit further comprises a controller operative to generate a plurality of signals for controlling operation of said multiplexer, said adder, and said RAM such that to perform said decimation algorithm.

19. A delta-sigma analog-to-digital converter as recited in claim 18 wherein said plurality of signals includes a selection signal for selecting one of said multiplexed inputs of said multiplexer, an inversion signal for indicating whether to generate a negative version of said selected one of said multiplexed inputs at said multiplexer output, a carry-in signal for said adder, a first address signal for said first address port of said RAM, and a second address signal for said second address port of said RAM.

20. A delta-sigma analog-to-digital converter as recited in claim 15 wherein said decimator circuit further comprises a register disposed between said multiplexer output and said second input of said adder.

21. A delta-sigma analog-to-digital converter as recited in claim 15 wherein said input signal has one of a +1 value and a −1 value.

* * * * *